(12) United States Patent
Guo et al.

(10) Patent No.: US 12,546,434 B2
(45) Date of Patent: Feb. 10, 2026

(54) BRACKET STRUCTURE, SUB-DISPLAY PANEL MODULE AND TILED DISPLAY DEVICE

(71) Applicants: BOE MLED Technology Co., Ltd., Beijing (CN); BOE Technology Group Co., Ltd., Beijing (CN)

(72) Inventors: Shaofei Guo, Beijing (CN); Shipeng Wang, Beijing (CN); Chao Tian, Beijing (CN); Zhonghua Li, Beijing (CN); Yiping Ruan, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 173 days.

(21) Appl. No.: 18/557,306

(22) PCT Filed: Nov. 11, 2022

(86) PCT No.: PCT/CN2022/131392
§ 371 (c)(1),
(2) Date: Oct. 26, 2023

(87) PCT Pub. No.: WO2024/098382
PCT Pub. Date: May 16, 2024

(65) Prior Publication Data
US 2025/0084953 A1 Mar. 13, 2025

(51) Int. Cl.
*F16M 11/04* (2006.01)
*G09F 9/302* (2006.01)

(52) U.S. Cl.
CPC ......... *F16M 11/043* (2013.01); *F16M 11/041* (2013.01); *G09F 9/3026* (2013.01)

(58) Field of Classification Search
CPC .... F16M 11/041; F16M 11/043; G09F 9/3026
See application file for complete search history.

(56) References Cited

U.S. PATENT DOCUMENTS 9,845,816 B2 * 12/2017 Brashnyk .................. G09F 9/33
9,903,567 B2 * 2/2018 Lan ........................ G09F 9/3026
(Continued)

FOREIGN PATENT DOCUMENTS

| CN | 101041172 A | 9/2007 |
|---|---|---|
| CN | 206779368 U | 12/2017 |

(Continued)

*Primary Examiner* — Stanton L Krycinski
(74) *Attorney, Agent, or Firm* — Ling Wu; Stephen Yang; Ling and Yang Intellectual Property

(57) ABSTRACT

A bracket structure is provided, which includes: a bracket body, at least one positioning structure is arranged on one side of the bracket body located on the assembly surface, and a positioning hole is provided at one end of the positioning structure away from the bracket body. The adjustment structure includes a connection portion provided with a first via hole and an adjustment portion connected with a side wall of the connection portion and provided with a second via hole. The first via hole includes a first part and a second part arranged sequentially along an extending direction of the first via hole and away from the bracket body, at least part of the positioning structure is located in the first part corresponding to the first via hole and connected with the first part, the positioning hole on the positioning structure is exposed by the corresponding first via hole.

20 Claims, 10 Drawing Sheets

(56) References Cited

U.S. PATENT DOCUMENTS

| | | | |
|---|---|---|---|
| 10,857,656 B2* | 12/2020 | Cai | G09F 9/00 |
| 11,382,222 B2* | 7/2022 | Hao | H05K 5/30 |
| 11,991,842 B2* | 5/2024 | Xu | G09F 9/3026 |
| 12,048,103 B2* | 7/2024 | Zhang | G09F 9/3026 |
| 12,156,352 B2* | 11/2024 | Zhang | F16M 13/02 |
| 2007/0226984 A1 | 10/2007 | Watanabe et al. | |
| 2019/0295459 A1 | 9/2019 | Gou et al. | |
| 2021/0378111 A1* | 12/2021 | Hao | G09F 9/3026 |
| 2024/0251512 A1* | 7/2024 | Guo | G09F 9/33 |
| 2025/0089194 A1* | 3/2025 | Yuan | G09F 9/3026 |

FOREIGN PATENT DOCUMENTS

| | | |
|---|---|---|
| CN | 209195884 U | 8/2019 |
| CN | 210397407 U | 4/2020 |
| CN | 215805684 U | 2/2022 |
| CN | 114999336 A | 9/2022 |
| JP | H05288211 A | 11/1993 |
| TW | M255909 U | 1/2005 |

\* cited by examiner

BRACKET STRUCTURE, SUB-DISPLAY PANEL MODULE AND TILED DISPLAY DEVICE

CROSS-REFERENCE TO RELATED APPLICATIONS

The present application is a U.S. National Phase Entry of International Application PCT/CN2022/131392 having an international filing date of Nov. 11, 2022, and entitled "Bracket Structure, Sub-display Panel Module and Tiled Display Device", the contents of which should be regarded as being incorporated herein by reference.

TECHNICAL FIELD

The present application relates to the display field, in particular to a bracket structure, a sub-display panel module and a tiled display device.

BACKGROUND

With rapid development of display technologies, tiled display devices have been more and more widely applied in large sites such as shopping malls, cinemas, stadiums, etc. The tiled display devices not only solve technical problems of high cost and difficult maintenance of a single large screen, but also have high scalability and can be applied to the display of images in various sizes.

SUMMARY

In a first aspect, a bracket structure is provided in an embodiment of the present disclosure, wherein the bracket structure includes:
  a bracket body provided with an assembly surface, wherein at least one positioning structure is provided on one side of the assembly surface of the bracket body, the positioning structure is connected with the bracket body, a positioning hole is provided at one end of the positioning structure away from the bracket body, and an extending direction of the positioning hole intersects with a plane where the assembly surface is located;
  at least one adjustment structure which is in one-to-one correspondence with the positioning structure, wherein the at least one adjustment structure includes a connection portion and an adjustment portion, the connection portion is provided with a first via hole; an extending direction of the first via hole is parallel to the extending direction of the positioning hole; the first via hole includes a first portion and a second portion arranged in sequence along the extending direction of the first via hole and in a direction away from the bracket body; at least a part of the positioning structure is located in a first portion of a corresponding first via hole and is connected with the first portion, and the positioning hole on the positioning structure is exposed by the corresponding first via hole; the adjustment portion is connected with a side wall of the connection portion; the adjustment portion is provided with a second via hole, and an extending direction of the second via hole intersects with the extending direction of the first via hole; the second via hole is communicated with the second portion of the first via hole, and an adjustment member is provided in the second via hole; and the adjustment member is configured to be movable along the second via hole and is extendable into the second portion of the first via hole.

In some embodiments, the connection portion is configured to be rotatable about the positioning structure such that the extending direction of the second via hole in the adjustment portion connected with the connection portion is changed.

In some embodiments, an outer wall of the positioning structure is provided with a first external thread, and an inner wall of the first portion of the first via hole is provided with a first internal thread matched with the first external thread, and the positioning structure is screwed with a corresponding connection portion through the first external thread and the first internal thread.

In some embodiments, a first accommodation groove with an opening towards the bracket body is provided at one end of the adjustment structure close to the bracket body, and a first elastic component is provided in the first accommodation groove, one end of the first elastic component is in contact with a groove bottom of the first accommodation groove, and the other end of the first elastic component is in contact with the bracket body.

In some embodiments, the first accommodation groove is an annular groove surrounding the first portion of the first via hole.

In some embodiments, an outer wall of the positioning structure is provided with a notch;
  a third via hole is provided on a side wall of the first portion of the first via hole, a detent pin is arranged in the third via hole, the detent pin is configured to be able to move along the third via hole, and one end of the detent pin close to the notch is extendable into the notch to engage with the notch.

In some embodiments, the notch is an annular notch surrounding the positioning hole;
  an inner wall of the third via hole is provided with a second internal thread, an outer wall of the detent pin is provided with a second external thread matched with the second internal thread, and the detent pin is screwed with the third via hole through the second internal thread and the second external thread.

In some embodiments, the adjustment member includes a stretchable deformable component and a stopper arranged sequentially along the extending direction of the second via hole and in a direction away from the connection portion, and the stopper is connected with the second via hole;
  the stretchable deformable component is configured to be capable of generating stretchable deformation in the extending direction of the second via hole; and
  the stopper is configured to be movable along the second via hole in response to external adjustment to change a position of the stopper in the second via hole.

In some embodiments, the inner wall of the second via hole is provided with a third internal thread, an outer wall of the stopper is provided with a third external thread adapted to the third internal thread, and the stopper is screwed with the second via hole through the third internal thread and the third external thread.

In some embodiments, the stretchable deformable component is a thermostrictive component;
  the thermostrictive component is configured to be elongated and deformed in the extending direction of the second via hole with an increase in temperature, and to produce shorten deformation in the extending direction of the second via hole with a decrease in temperature.

In some embodiments, the stretchable deformable component includes a memory spring.

In some embodiments, a limit groove is provided at an end of the adjustment portion away from the connection portion, an extending direction of the limit groove is parallel to the extending direction of the second via hole, the limit groove has a first length in the extending direction of the limit groove, the second via hole has a second length in the extending direction of the second via hole, and the first length is less than the second length; and the limit groove is located on one side of the second via hole and is communicated with the second via hole, and a part of the stretchable deformable component is located in the limit groove.

In some embodiments, the limit groove is located on one side of the second via hole adjacent to the bracket body.

In some embodiments, the connection portion and the adjustment portion are integrally formed.

In some embodiments, the assembly surface of the bracket body is provided with a plurality of second accommodation grooves which are in one-to-one correspondence with the positioning structures; and the positioning structures are located in the corresponding second accommodation grooves, one end of each positioning structure close to the bracket body is connected with a groove bottom of a corresponding second accommodation groove, and a part of the connection portion is located in the second accommodation groove.

In some embodiments, an outer edge of the assembly surface is rectangular, and four positioning structures are provided on one side of the bracket body on the assembly surface, and the four positioning structures are located respectively in four corner areas of the assembly surface whose outer edge is rectangular.

In some embodiments, the assembly surface is divided into an intermediate region and a peripheral region surrounding the intermediate region, and the positioning structures are located in the peripheral region; and a plurality of hollow structures penetrating the bracket body are provided in the intermediate region.

In some embodiments, a first fixation component is further provided on the assembly surface and located in the peripheral region, and the first fixation component is configured to be fixed to the casing.

In a second aspect, a sub-display panel module is further provided in an embodiment of the present disclosure. The sub-display panel module includes a bracket structure and a display substrate as described in the first aspect, wherein the bracket body in the bracket structure further includes a bearing surface opposite to the assembly surface, and the display substrate is located on the bearing surface.

In a third aspect, a tiled display device is further provided in an embodiment of the present disclosure. The tiled display device includes a plurality of sub-display panel modules and a casing for assembling the sub-display panel modules, wherein at least one of the sub-display panel modules is the sub-display panel modules provided in the second aspect.

In some embodiments, the casing is provided with a positioning pin configured to extend into the positioning hole exposed by the first via hole through a corresponding first via hole;

a part of the adjustment member extending into the second portion of the first via hole is in contact with a part of the positioning pin located in the second portion of the first via hole and the two parts are pressed against each other.

In some embodiments, the connection portion in any of the adjustment structures is located on a side of the adjustment portion away from a central region of the tiled display device, and the extending direction of the second via hole in the adjustment portion faces the central region of the tiled display device.

In some embodiments, a plurality of the adjustment structures are provided in the bracket structure, and extending directions of the second via holes on the adjustment portions in the plurality of adjustment structures located in a same bracket structure are parallel.

DETAILED DESCRIPTION

Figure 1A:
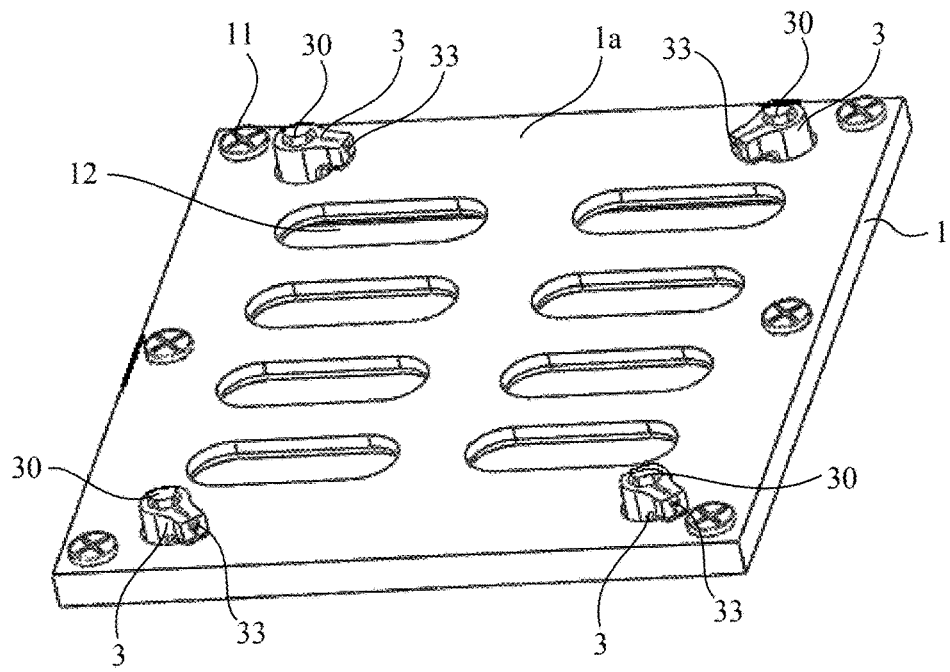
FIG. 1A is a schematic structural diagram of a bracket structure according to an embodiment of the present disclosure.

To make those skilled in the art better understand technical solutions of the present disclosure, the present disclosure is described in further detail below with reference to the accompanying drawings and specific implementations.

The present disclosure will be described in more detail below with reference to the accompanying drawings. Throughout the drawings, like elements are denoted by like reference numerals. For the sake of clarity, not all parts in the drawings are drawn to scale. In addition, some well-known parts may not be shown in the figure.

Many specific details of the present disclosure such as structures, materials, dimensions, processing processes, and techniques of components are described below for better understanding of the present disclosure. However, as will be understood by those skilled in the art, the present disclosure may be implemented without following these specific details.

"First", "second", and similar terms used in the embodiments of the present disclosure do not represent any order, quantity, or importance, but are only used for distinguishing different components. Likewise, terms such as "include", "contain" and the like mean that elements or objects appearing before the words cover elements or objects listed after the words and their equivalents, but do not exclude other elements or objects. Similar words such as "connected" or "joint" between two structures include not only a direct contact between two structures to achieve connection, but also indirect connection between two structures through other structures.

In addition, formation of "fixation" between two structures in the present disclosure merely means that the two structures cannot be separated in a certain state or moment, but the two structures may also be separated in other states or moments. For example, when a screw is screwed into a corresponding screw hole, the screw is fixed to the screw hole, but the screw may also be screwed out of the screw hole so that the screw is separated from the screw hole.

A tiled display device includes a casing and a plurality of sub-display panel modules tiled on the casing. Each sub-display panel module includes a bracket structure and a display substrate. The bracket structure is provided with a support surface and an assembly surface which are opposite to each other. The support surface is configured to fit the display substrate, and the assembly surface is configured to be assembled with the casing.

In related technologies, a plurality of positioning pins are arranged on the casing, and positioning holes are provided on the assembly surface of the bracket structure. Positioning of the sub-display panel module on the casing can be achieved by fitting the positioning pins with the positioning holes. However, in practical application, it is found that when a positioning hole on the bracket structure is sleeved on an outer side of a positioning pin for positioning, if a difference between an aperture of the positioning hole and a diameter of a part of the positioning pin for extending into the positioning hole is small, a rigid collision between the positioning hole and the part of the positioning pin for extending into the positioning hole is easy to occur, which makes the assembly difficult. However, if the difference between the aperture of the positioning hole and the diameter of the part of the positioning pin for extending into the positioning hole is large, the assembly difficulty of the positioning hole and the positioning pin can be reduced. However, because of a large gap between the positioning hole and the part of the positioning pin located in the positioning hole, a series of problems such as the positioning pin sliding out of the positioning hole and dislocation between the positioning pin and the positioning hole are easy to occur in subsequent use processes. In order to solve the problems such as the positioning pin sliding out of the positioning hole and dislocation between the positioning pin and the positioning hole, the relative fixation between the bracket structure and the casing will be increased by magnetic assistance. In some cases, if the magnetic force is designed to be too large, risks of bumping and damages will increase in an assembly process.

Therefore, how to reduce an operation difficulty in the assembly process of sub-display panel modules and the casing, improve the assembly yield and ensure the stability after assembly is a technical problem to be solved urgently in this field.

Figure 1B:
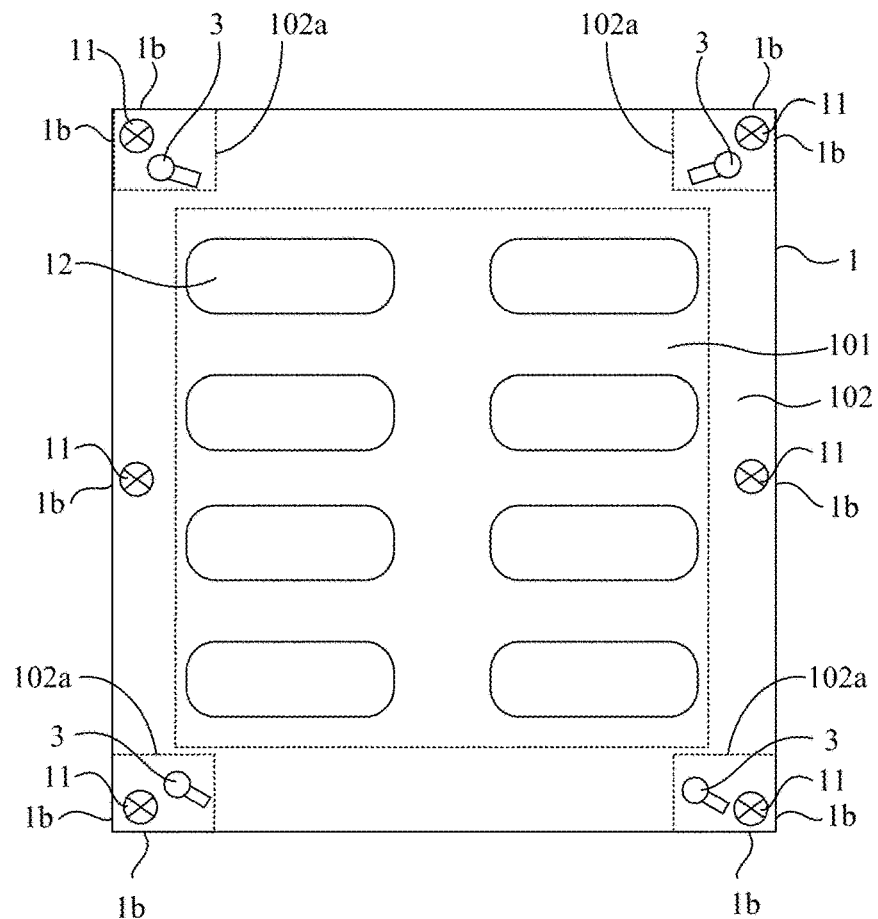
FIG. 1B schematically illustrates a top view of the bracket structure shown in FIG. 1A.
Figure 2:
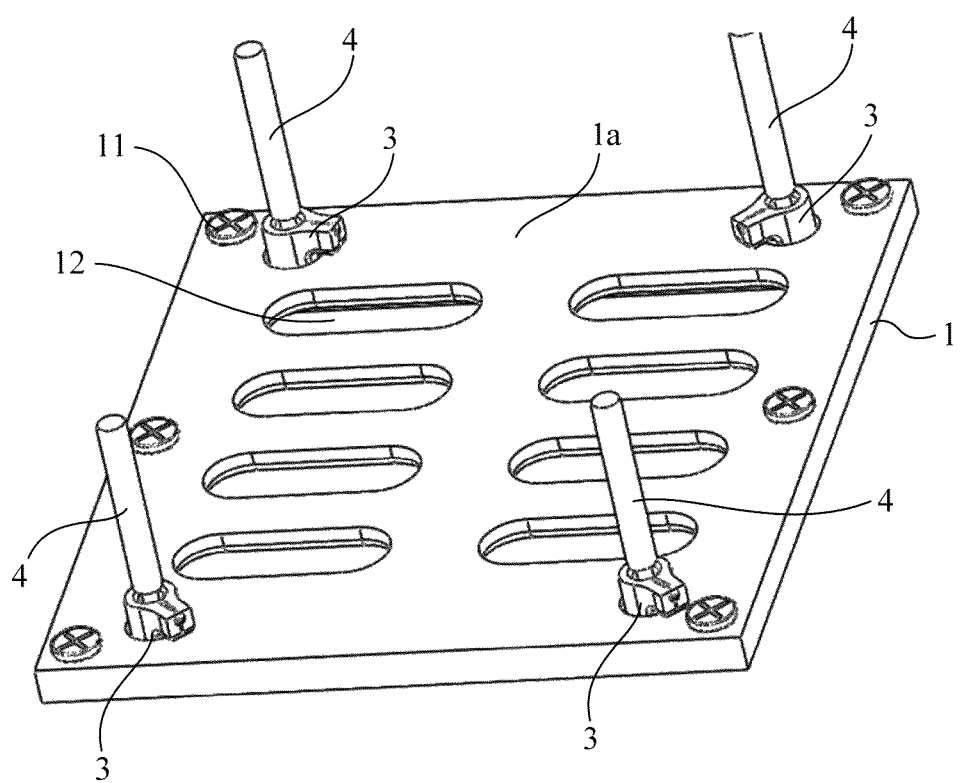
FIG. 2 is a schematic structural diagram in which a positioning pin on a casing is placed in a positioning hole on the bracket structure.
Figure 3:
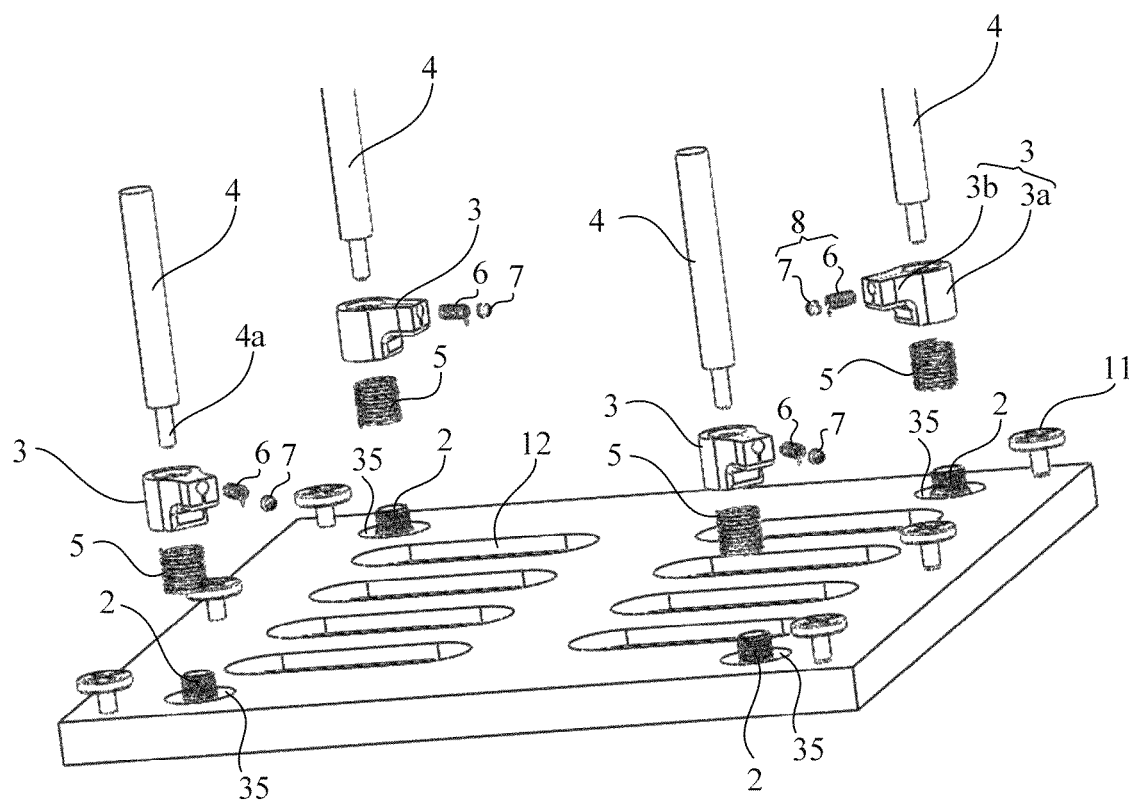
FIG. 3 is an exploded structure diagram of the structure shown in FIG. 2.
Figure 4:
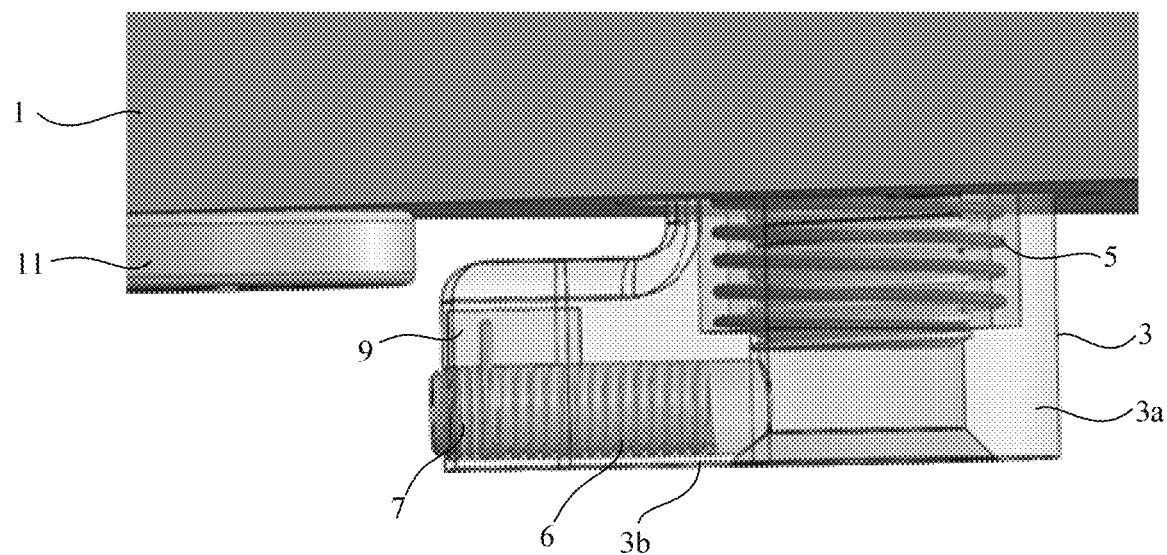
FIG. 4 is a schematic structural diagram of a partial area on a bracket structure in an embodiment of the present disclosure.
Figure 5:
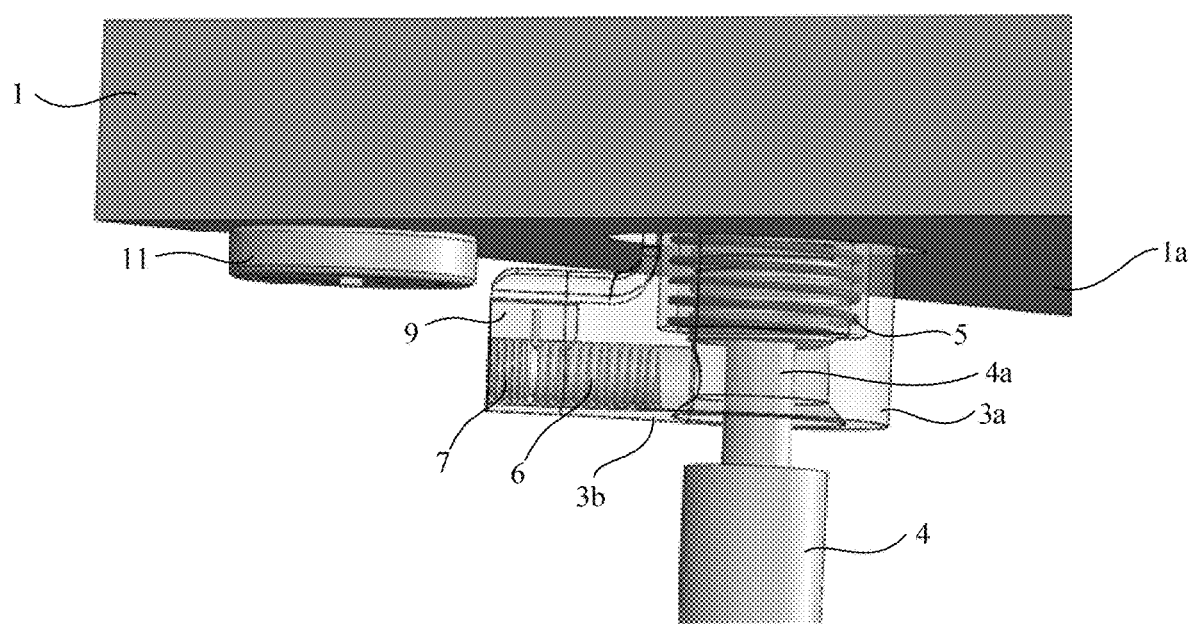
FIG. 5 is a schematic structural diagram of a positioning pin placed in the structure shown in FIG. 4.
Figure 6:
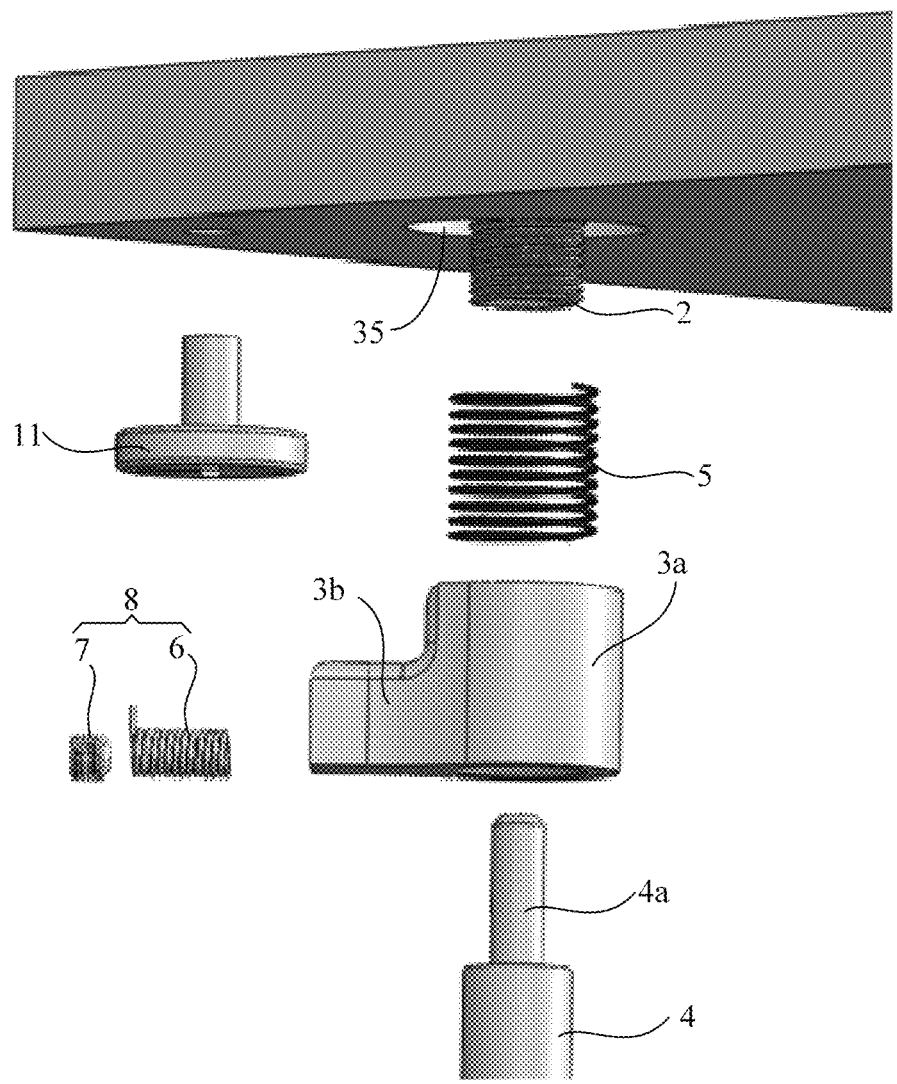
FIG. 6 is an exploded structure diagram of the structure shown in FIG. 5.
Figure 7:
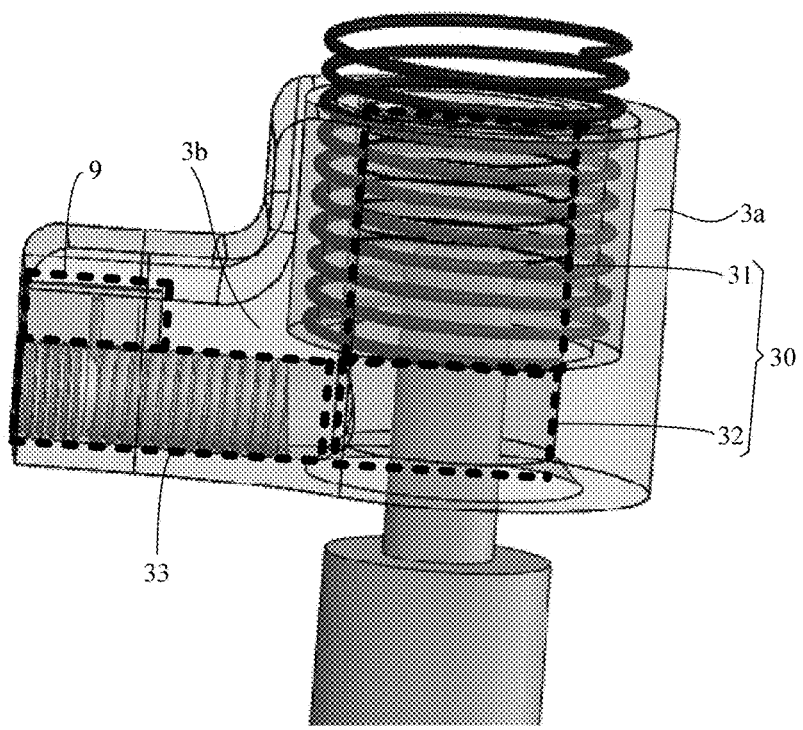
FIG. 7 is a schematic structural diagram of an adjustment structure in an embodiment of the present disclosure.
Figure 8:
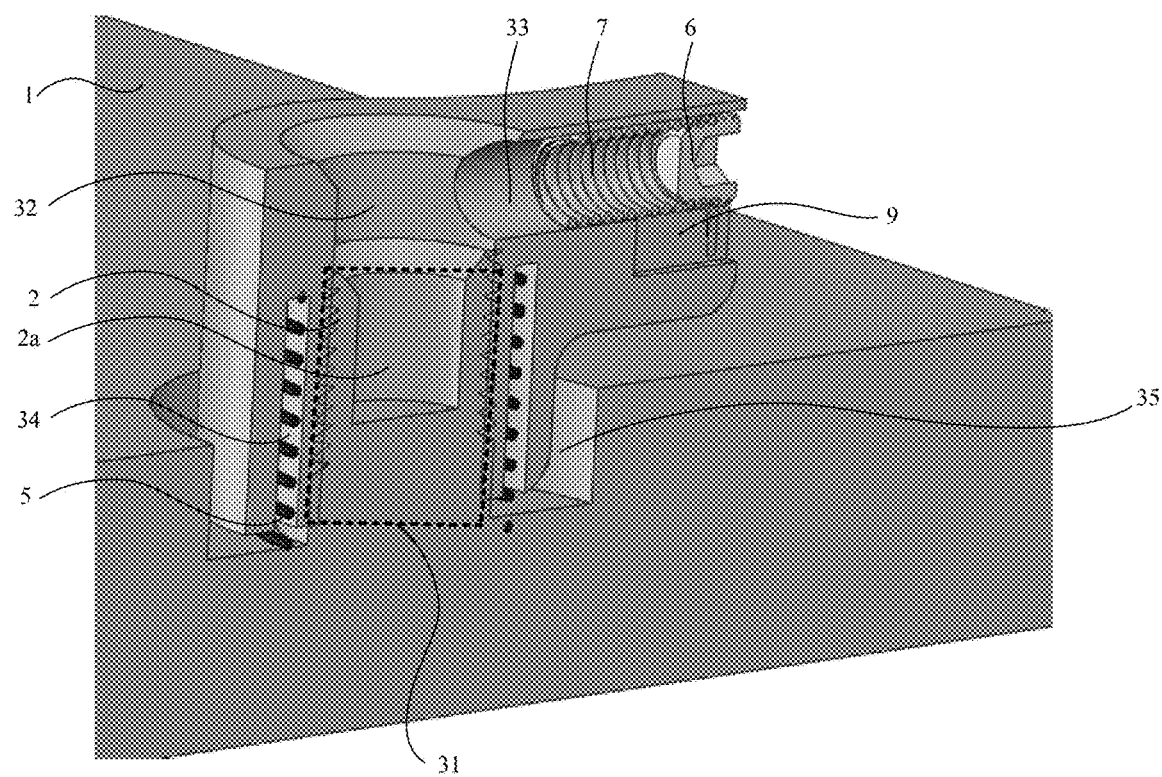
FIG. 8 is a schematic cross-sectional view of an adjustment structure on a bracket structure in an embodiment of the present disclosure.
Figure 9:
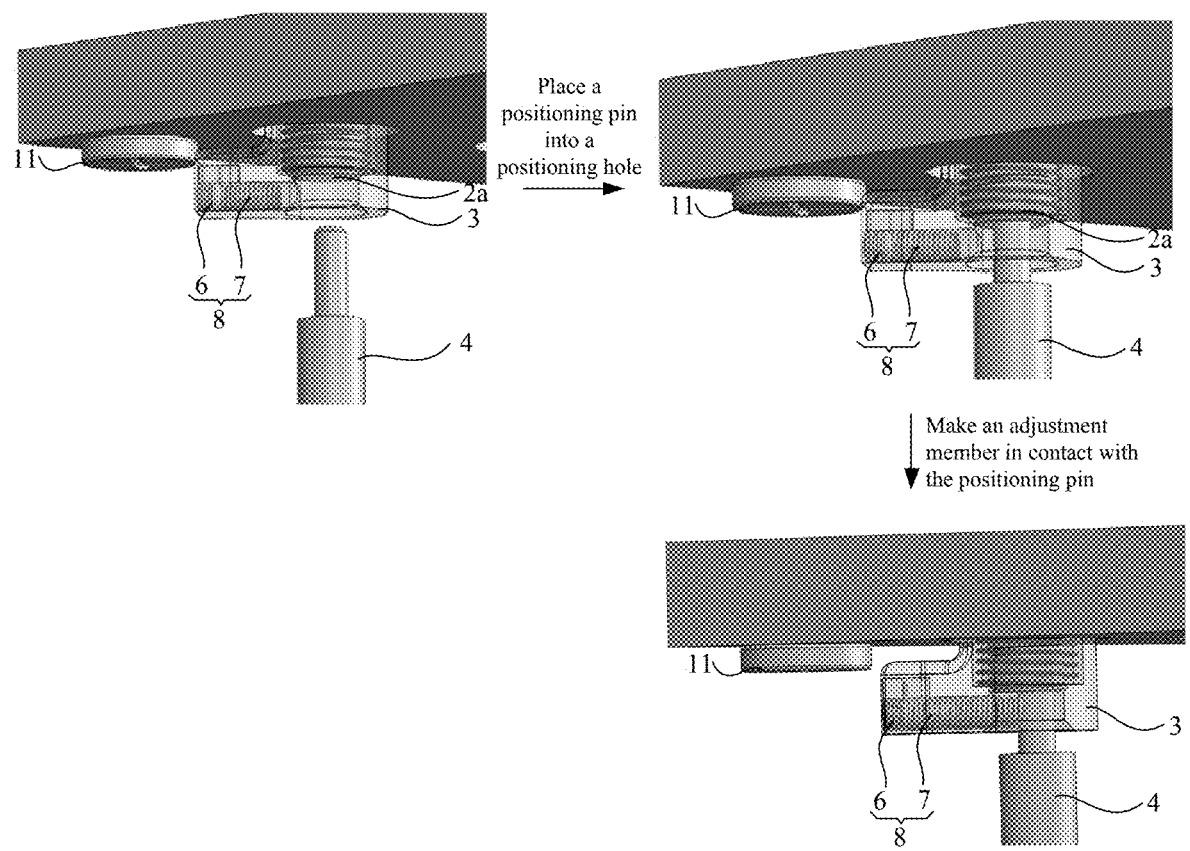
FIG. 9 is a schematic structural diagram of three different states: the positioning pin is not placed in the positioning hole, the positioning pin is placed in the positioning hole but the adjustment member is not in contact with the positioning pin, and the positioning pin is placed in the positioning hole and the adjustment member is in contact with the positioning pin.

FIG. 1A is a schematic structural diagram of a bracket structure according to an embodiment of the present disclosure. FIG. 1B schematically illustrates a top view of the bracket structure shown in FIG. 1A. FIG. 2 is a schematic structural diagram in which a positioning pin on a casing is placed in a positioning hole on the bracket structure. FIG. 3 is an exploded structure diagram of the structure shown in FIG. 2. FIG. 4 is a schematic structural diagram of a partial area on the bracket structure in an embodiment of the present disclosure. FIG. 5 is a schematic structural diagram of a positioning pin placed in the structure shown in FIG. 4. FIG. 6 is an exploded structure diagram of the structure shown in FIG. 5. FIG. 7 is a schematic structural diagram of an adjustment structure in an embodiment of the present disclosure. FIG. 8 is a schematic cross-sectional view of an adjustment structure on a bracket structure in an embodiment of the present disclosure. FIG. 9 is a schematic structural diagram of three different states: the positioning pin is not placed in the positioning hole, the positioning pin is placed in the positioning hole but the adjustment member is not in contact with the positioning pin, and the positioning pin is placed in the positioning hole and the adjustment member is in contact with the positioning pin. As shown in FIGS. 1A to 9, a bracket structure provided in an embodiment of the present disclosure includes a bracket body 1 and an adjustment structure 3.

The bracket body 1 has a support surface 1b and an assembly surface 1a which are opposite to each other. The support surface 1b of the bracket body 1 is a surface of the bracket body 1 which is configured to support a display substrate (not shown). Specifically, the display substrate may be fixed on the support surface 1b. The assembly surface 1a of the bracket body 1 is a surface of the bracket body 1 which faces towards the casing and is assembled with the casing.

At least one positioning structure 2 is provided on one side of the assembly surface 1a of the bracket body 1. The positioning structure 2 is connected with the bracket body 1, and a positioning hole 2a is provided at one end of the at least one positioning structure 2 away from the bracket body 1, and an extending direction of the positioning hole 2a intersects with a plane where the assembly surface 1a is located.

There is one-to-one correspondence between the adjustment structure 3 and the positioning structure 2. The adjustment structure 3 includes a connection portion 3a and an adjustment portion 3b. The connection portion 3a is provided with a first via hole 30. An extending direction of the first via hole 30 is parallel to an extending direction of the positioning hole 2a. The first via hole 30 includes a first portion 31 and a second portion 32 arranged in sequence along the extending direction of the first via hole 30 and a direction away from the bracket body 1. At least a part of the positioning structure 2 is located in a first portion 31 of a corresponding first via hole 30 and is connected with the first portion 31, and the positioning hole 2a on the positioning structure 2 is exposed by a corresponding first via hole 30 so that a positioning pin 4 on the casing extends into the positioning hole 2a through the first via hole 30. The adjustment portion 3b is connected with a side wall of the connection portion 3a. The adjustment portion 3b is provided with a second via hole 33, and an extending direction of the second via hole 33 intersects with the extending direction of the first via hole 30. The second via hole 33 is communicated with the second portion 32 of the first via hole 30, and an adjustment member 8 is provided in the second via hole 33. The adjustment member 8 is configured to be movable along the second via hole 33 and can extend into the second portion 32 of the first via hole 30 to contact with a part 4a of the positioning pin 4 which is located in the second portion 32 of the first via hole 30, so as to effectively limit a position of the positioning pin 4.

Referring to FIG. 9, in an embodiment of the present disclosure, when the sub-display panel module is assembled to the casing, the positioning pin 4 may be first placed into a corresponding positioning hole 2a, then the adjustment member 8 may be extended into the first via hole 30 and contacted with a part of the positioning pin 4 located in a second portion 32 of the first via hole 30, so that an acting force which pushes the adjustment member 8 and the positioning pin 4 against each other is generated, thereby limiting the position of the positioning pin 4, which can effectively improve or even completely avoid problems such as the positioning pin 4 sliding out of the positioning hole 2a, and dislocation between the positioning pin 4 and the positioning hole 2a.

In the present disclosure, the adjustment member is adjusted in a variety of ways so that the adjustment member 8 is extended into the first via hole 30. For example, the adjustment member 8 may be engaged and fixed with the second via hole 33, and the adjustment member 8 may be finally engaged at a desired position by pushing the adjustment member 8 to move along the second via hole 33 in a direction close to the first via hole 30. For another example, the adjustment member 8 may be screwed with the second via hole 33, and the adjustment member 8 may be moved along the second via hole 33 in the direction close to the first via hole 30 and finally fixed to a desired position by rotating the adjustment member 8. No further examples will be provided for other cases.

In the embodiment of the present disclosure, the position of the positioning pin 4 may be limited by the adjustment member 8 after the positioning pin 4 is extended into the positioning hole 2a, a difference between an aperture of the positioning hole 2a and a diameter of a part 4a of the positioning pin 4 which is extended into the positioning hole 2a may be designed to be relatively large, so as to facilitate an assembly operation of the positioning hole 2a and the positioning pin 4. Furthermore, during subsequent use, the adjustment member 8 can keep limiting the positioning pin 4, which can effectively improve a stability after assembly. In addition, a whole assembly process is relatively simple, and requirements on assembly environment are low, which can effectively improve the assembly yield. Thus, the bracket structure provided in the embodiment of the present disclosure has advantages such as low difficulty in the assembly operation, high assembly yield, and strong assembly stability.

In the embodiment of the present disclosure, an exemplary description is made with an example in which the extending direction of the first via hole 30 is perpendicular to a plane where the assembly surface 1a is located and the extending direction of the second via hole 33 is perpendicular to the assembly surface 1a, and contents of the exemplary description are not limited to technical solutions of the present disclosure.

In the present disclosure, the adjustment member 8 is in contact with the positioning pin 4, so that the adjustment structure 3 and the positioning structure 2 (as well as a part of the bracket structure near the positioning structure 2) can be slightly moved relative to the positioning pin 4 by controlling an amount of extension by which the adjustment member 8 extends from the second via hole 33 to the first via hole 30. Specifically, on the premise that the adjustment member 8 is in contact with the positioning pin 4, the adjustment structure 3 and the positioning structure 2 (as well as the part of the bracket structure located near the positioning structure 2) are slightly moved along the second via hole 33 and away from the positioning pin 4 under the action of a mutual pressing force between the adjustment member 8 and the positioning pin 4 as the amount of extension by which the adjustment member 8 extends from the second via hole 33 to the first via hole 30 increases. On the premise that the adjustment member 8 is in contact with the positioning pin 4, the adjustment structure 3 and the positioning structure 2 (as well as the part of the bracket structure near the positioning structure 2) are slightly moved along the second via hole 33 and in the direction close to the positioning pin 4 under the action of the mutual pressing force between the adjustment member 8 and the positioning pin 4 as the amount of extension by which the adjustment member 8 extends from the second via hole 33 to the first via hole 30 decreases.

Therefore, the extending direction of the second via hole in the present disclosure determines the direction in which the adjustment structure 3 and the positioning structure 2 are slightly moved, and the amount of extension by which the adjustment member 8 extends from the second via hole 33 to the first via hole 30 determines whether the adjustment structure 3 and the positioning structure 2 are moved close to the positioning pin 4 or away from the positioning pin 4.

In some embodiments, the connection portion 3a is configured to be rotatable about the positioning structure 2 such that the extending direction of the second via hole 33 in the adjustment portion 3b connected with the connection portion 3a is changed. In the embodiment of the present disclosure, the connection portion 3a is rotatable about the positioning structure 2, so that the adjustment portion 3b is also rotatable about the positioning structure 2, at which time the extending direction of the second via hole 33 in the adjustment portion 3b can be changed. That is, the adjustment member 8 can be brought into contact with the positioning pin 4 in different directions, i.e. the direction of the mutual pressing force between the adjustment member 8 and the positioning pin 4 can be controlled. Accordingly, the movement direction in which the adjustment structure 3 and the positioning structure 2 are slightly moved relative to the positioning pin 4 can also be controlled by the adjustment member 8 to meet different requirements. It will be described in detail with specific examples later.

In some embodiments, an outer wall of the positioning structure 2 is provided with a first external thread, and an inner wall of the first portion 31 of the first via hole 30 is provided with a first internal thread matched with the first external thread, and the positioning structure 2 is screwed with a corresponding connection portion 3a through the first external thread and the first internal thread. The positioning structure 2 and the corresponding connection portion 3a are connected by screw connection, so that when tightness between the positioning structure 2 and the connection portion 3a reaches a minimum firmness required for a firm connection between the positioning structure 2 and the connection portion 3a, the connection portion 3a still has a certain rotatable margin for the connection portion 3a to continue rotating about the positioning structure 2. In other words, according to the technical solutions of the present disclosure, the firm connection between the positioning structure 2 and the corresponding connection portion 3a can be ensured, and at the same time, the connection portion 3a is also rotatable about the positioning structure 2 to adjust the extending direction of the second via hole 33.

In some embodiments, one end of the adjustment structure 3 close to the bracket body 1 is provided with a first accommodation groove 34 with an opening facing the bracket body 1, and a first elastic component 5 is provided in the first accommodation groove 34. One end of the first elastic component 5 is in contact with a groove bottom of the first accommodation groove 34, and the other end of the first elastic component 5 is in contact with the bracket body 1. The first elastic component 5 located in the first accommodation groove 34 can always be in a compressed state, and the first internal thread and the first external thread can be pushed against each other in the extending direction of the first via hole 30 by the first elastic component 5, so that the tightness between the positioning structure 2 and the connection portion 3*a* is improved (the first elastic component 5 is used for tightening). At this time, after the tightness between the positioning structure 2 and the connection portion 3*a* reaches the minimum firmness required for the firm connection between the positioning structure 2 and the connection portion 3*a*, the connection portion 3*a* has a larger rotatable margin, so as to ensure that the connection portion 3*a* can continue to rotate for at least one complete circle about the positioning structure 2, and the extending direction of the second via hole 33 can be adjusted to any direction parallel to the plane where the assembly surface 1*a* is located, i.e. 360° omni-directional adjustment is achieved.

In some embodiments the first accommodation groove 34 is an annular groove around the first portion 31 of the first via hole 30. The first elastic component 5 is a spring placed in the annular groove and the spring is sleeved outside the first portion 31 of the first via hole 30.

In some embodiments, the adjustment member 8 includes a stretchable deformable component 6 and a stopper 7 arranged in order along the extending direction of the second via hole 33 and away from the connection portion 3*a*. The stopper 7 is connected to the second via hole 33. The stretchable deformable component 6 is configured to generate stretch deformation in the extending direction of the second via hole 33. The stopper 7 is configured to move along the second via hole 33 in response to external adjustment to change the position of the stopper 7 in the second via hole 33.

In some embodiments, the inner wall of the second via hole 33 is provided with a third internal thread, and an outer wall of the stopper 7 is provided with a third external thread matched with the third internal thread, and the stopper 7 is screwed with the second via hole 33 through the third internal thread and the third external thread. That is, the position of the stopper 7 in the second via hole 33 can be adjusted by rotating the stopper 7. In some embodiments, the stopper 7 may be a screw.

In some embodiments, the stretchable deformable component 6 is a thermostrictive component. The thermostrictive component is configured to produce an elongation deformation in the extending direction of the second via hole 33 with an increase in temperature within a preset temperature range, and to produce a shortening deformation in the extending direction of the second via hole 33 with a decrease in temperature.

In the embodiment of the present disclosure, during assembling, the temperature of the bracket structure is relatively low, the thermostrictive component in the bracket structure has an initial length in the extending direction of the second via hole 33. One end of the thermostrictive component is in contact with a stopper 7, and position of the positioning pin 4 can be limited by adjusting a position of the stopper 7 so that the other end of the thermostrictive component is in contact with the positioning pin 4. In the subsequent display process, heat generated after the display substrate is lit will cause the temperature of the bracket structure to rise, then the thermostrictive component in the bracket structure is elongated and deformed, and the mutual presssing force between the thermostrictive component and the positioning pin 4 will increase, and the adjustment structure 3 and the positioning structure 2 (as well as the part of the bracket structure near the positioning structure 2) will be slightly moved along the second via hole 33 in a direction away from the positioning pin 4.

Based on the thermostrictive component, the mutual pressing force between the thermostrictive component and the positioning pin 4 in the bracket structure increases with the temperature of the bracket structure during usage after the sub-display panel module is assembled, and the stability after assembly can be effectively guaranteed. In addition, the thermostrictive component can also automatically adjust a splicing gap between adjacent bracket structures in the tiled display device. It will be described in detail with specific examples later.

In some embodiments, the stretchable deformable component 6 includes: a memory spring. The memory spring is also called a Shape Memory Alloys (SMA) spring. A shape memory alloy is a material composed of more than two metal elements with Shape Memory Effect (SME) through thermoelastic and martensitic transformation and its inverse transformation, which can change its shape with the change of its own temperature.

It should be noted that the above case in which the stretchable deformable component 6 is a thermostrictive component is only an optional embodiment of the present disclosure. The stretchable deformable component 6 in the present disclosure may also be other members or structures having stretchable functions, such as ordinary springs, electrostrictive members (e.g. piezoelectric ceramics), magnetostrictive members piezoelectric ceramics, motor-driven stretchable members, and the like.

In some embodiments, a limit groove 9 is provided at an end of the adjustment portion 3*b* away from the connection portion 3*a* limit groove. An extending direction the limit groove 9 is parallel to the extending direction of the second via hole 33. The limit groove 9 has a first length in its extending direction, the second via hole 33 has a second length in its extending direction, and the first length is smaller than the second length. The limiting groove 9 is located on one side of the second via hole 33 and is communicated with the second via hole 33, and a part of the stretchable deformable component 6 is located in the limiting groove 9. In the embodiment of the present disclosure, by providing the limit groove 9 and placing the part of the stretchable deformable component 6 in the limit groove 9, the position of stretchable deformable component 6 can be effectively limited, and the stretchable deformable component 6 can be prevented from falling out from one end of the second via hole 33 near the connection portion 3*a*, while a maximum advance distance of the stopper 7 in the second via hole 33 can be limited.

In some embodiments, the limit groove 9 is located on a side of the second via hole 33 close to the bracket body 1.

In some embodiments, the connection portion 3*a* and the adjustment portion 3*b* are integrally formed.

In some embodiments, the assembly surface 1*a* of the bracket body 1 is provided with a plurality of second accommodation grooves 35 which correspond one-to-one to positioning structures 2. The positioning structures 2 are located in corresponding second accommodation grooves 35. An end of each positioning structure 2 close to the bracket body 1 is connected to a groove bottom of a corresponding second accommodation groove 35, and a part of the connection portion 3a is located in the second accommodation groove 35. With this arrangement, a contact area (for example, a thread contact area) between the connection portion 3a and the positioning structure 2 can be increased, which is beneficial to improving the connection firmness between the connection portion 3a and the positioning structure 2.

Figure 10:
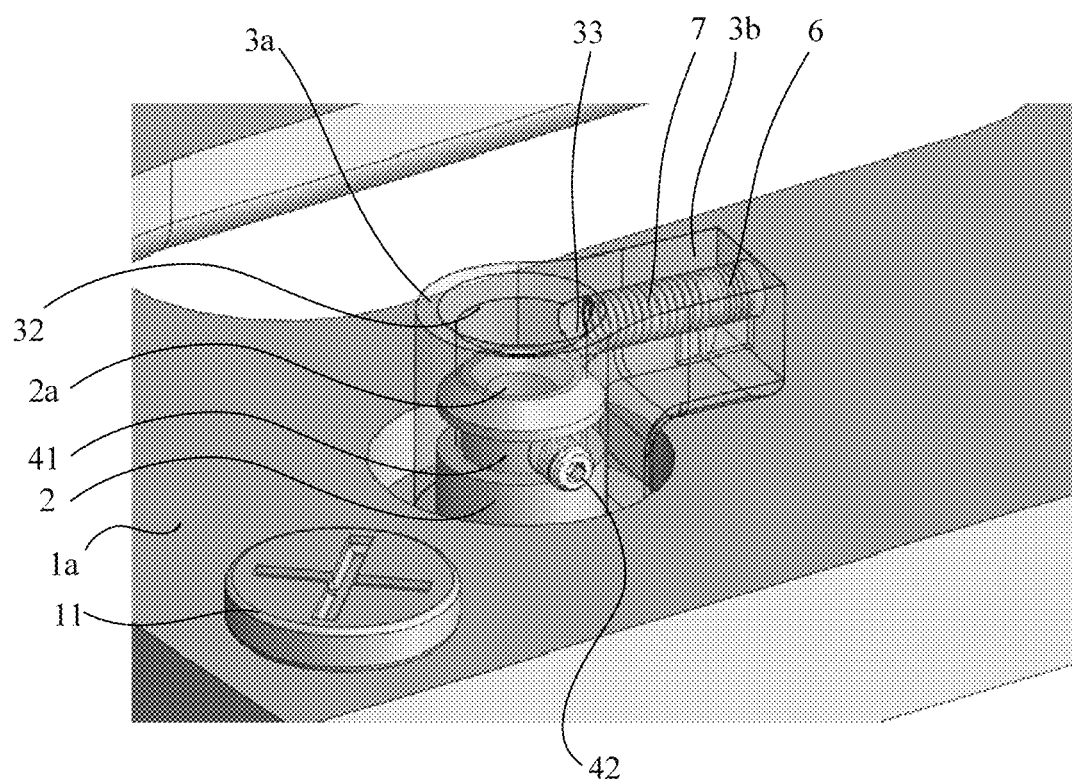
FIG. 10 is another schematic structural diagram of a partial area on a bracket structure in an embodiment of the present disclosure.

FIG. 10 is another schematic structural diagram of a pixel structure in an embodiment of the present disclosure. As shown in FIG. 10, unlike the case where the connection portion 3a is screwed to the positioning structure 2 in the previous embodiment, in the scheme shown in FIG. 10, the connection portion 3a is engaged to the positioning structure 2. Specifically, the outer wall of the positioning structure 2 is provided with a notch 41. A third via hole is provided on an sidewall of the first portion 31 in the first via hole 30, and a detent pin 42 is provided in the third via hole. The detent pin 42 is configured to be movable along the third via hole and an end of the detent pin 42 close to the notch 41 can extend into the notch 41 to be engaged with the notch 41.

In some embodiments, the notch 41 is an annular notch 41 surrounding the positioning hole 2a. The inner wall of the third via hole is provided with a second internal thread, the outer wall of the detent pin 42 is provided with a second external thread matched with the second internal thread, and the detent pin 42 is screwed with the third via hole through the second internal thread and the second external thread. By rotating the detent pin 42, the extension amount by which the detent pin 42 extends from the third via hole to the first via hole is controlled, thereby enabling the detent pin 42 to extend into the notch 41. When the detent pin 42 extends into the notch 41 but does not come into contact with the bottom of the detent pin 41 as a working state, the connection portion 3a is rotatable around the positioning structure 2 to adjust the extending direction of the second via hole 33 in the adjustment portion 3b. As another working state, the detent pin 42 extends into the notch 41 and is in contact with the bottom of the notch 41 and can generate a certain mutual pressing force with the bottom of the notch 41, so as to achieve the firm connection between the positioning structure 2 and the connection portion 3a (the tightness between the positioning structure 2 and the connection portion 3a reaches a minimum tightness requirement for the firm connection between the positioning structure 2 and the connection portion 3a).

It should be noted that in the embodiment of the present disclosure, the connection portion 3a and the positioning structure 2 can also be connected with each other in a firm manner. In some embodiments, while securely connection between the connection portion 3a and the positioning structure 2 can be achieved, the connection portion 3a is also rotatable about the positioning structure 2.

With continued reference to FIGS. 1A and 1B, in some embodiments, an outer edge of the assembly surface 1a is rectangular, and four positioning structures 2 are provided on the assembly surface 1a of the bracket body 1, and the four positioning structures 2 are respectively located in four corner areas 102a of the assembly surface 1a whose outer edge is rectangular.

In some embodiments, the assembly surface 1a is divided into an intermediate region 101 and a peripheral region 102 surrounding the intermediate region, with the positioning structures 2 located in the peripheral region 102 (the aforementioned corner areas 102a located in the peripheral region 102). A plurality of hollow structures 12 penetrating the bracket body 1 are provided in the intermediate region 101. When the display substrate is placed on the support surface of the bracket structure, a connector on a circuit board on the back of the display substrate can be electrically connected with a corresponding connector on the casing through the hollow structure 12, so that a required working voltage and display signal of the display substrate are transmitted to the display substrate through the casing.

In some embodiments, a first fixation component 11 is further provided on the assembly surface 1a and located in the peripheral region and the first fixation component 11 is configured to be fixed to the casing. The casing is provided with a second fixation component adapted to the first fixation component 11, and the first fixation component 11 and the second fixation component can be fixed and assembled to realize the same fixation of the bracket structure.

As an example, the first fixation component 11 is an iron structure, and the second fixation component is a magnetic attraction structure (e.g. a magnet or an electromagnet), and the first fixation component 11 and the second fixation component can be fixed by a magnetic attraction force. In the embodiment of the present disclosure, the first fixation component 11 and the second fixation component may be fixed in other ways such as engaging fixing, screw fixing and the like, which will not be exemplified here.

In the present disclosure, different structures in the above-mentioned different embodiments can be combined with each other, and the new technical scheme obtained through such combination should also belong to the protection scope of the present disclosure.

Based on the same inventive concept, an embodiment of the present disclosure further provides a sub-display panel module. The sub-display panel module includes a bracket structure and a display substrate. A support surface in the bracket structure carries the display substrate. The bracket structure may be the bracket structure provided in the above embodiment.

In the embodiment of the present disclosure, one or a plurality of display substrates may be carried on one bracket structure.

Based on the same inventive concept, an embodiment of the present disclosure further provides a tiled display device, which includes a plurality of sub-display panel modules and a casing for assembling the sub-display panel modules, and at least one of the sub-display panel modules may be the sub-display panel module provided in any of the above embodiments.

In some embodiments each of the sub-display panel modules in the tiled display device may be the sub-display panel modules provided in any of the previous embodiments.

In some embodiments, the casing is provided with a positioning pin 4. The positioning pin 4 is configured to extend through a corresponding first via hole 30 into a positioning hole 2a exposed by the first via hole 30. A part of the adjustment member 8 extending into the second portion 32 of the first via hole 30 is in contact with a part of the positioning pin 4 in the second portion 32 of the first via hole 30 and the two parts are pressed against each other.

Figure 11:
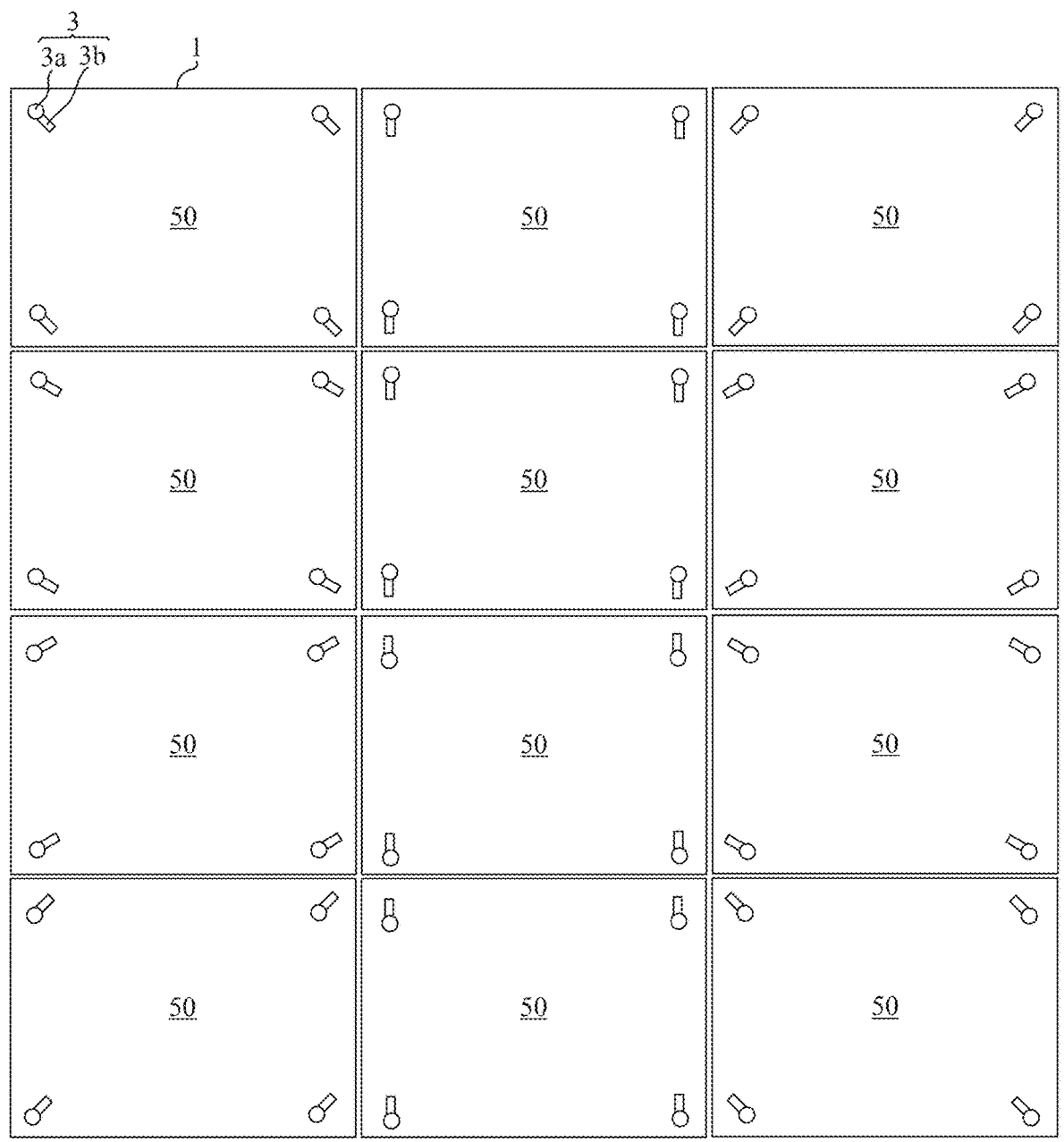
FIG. 11 is a schematic diagram when splicing a plurality of sub-display panel modules in an embodiment of the present disclosure.
Figure 12:
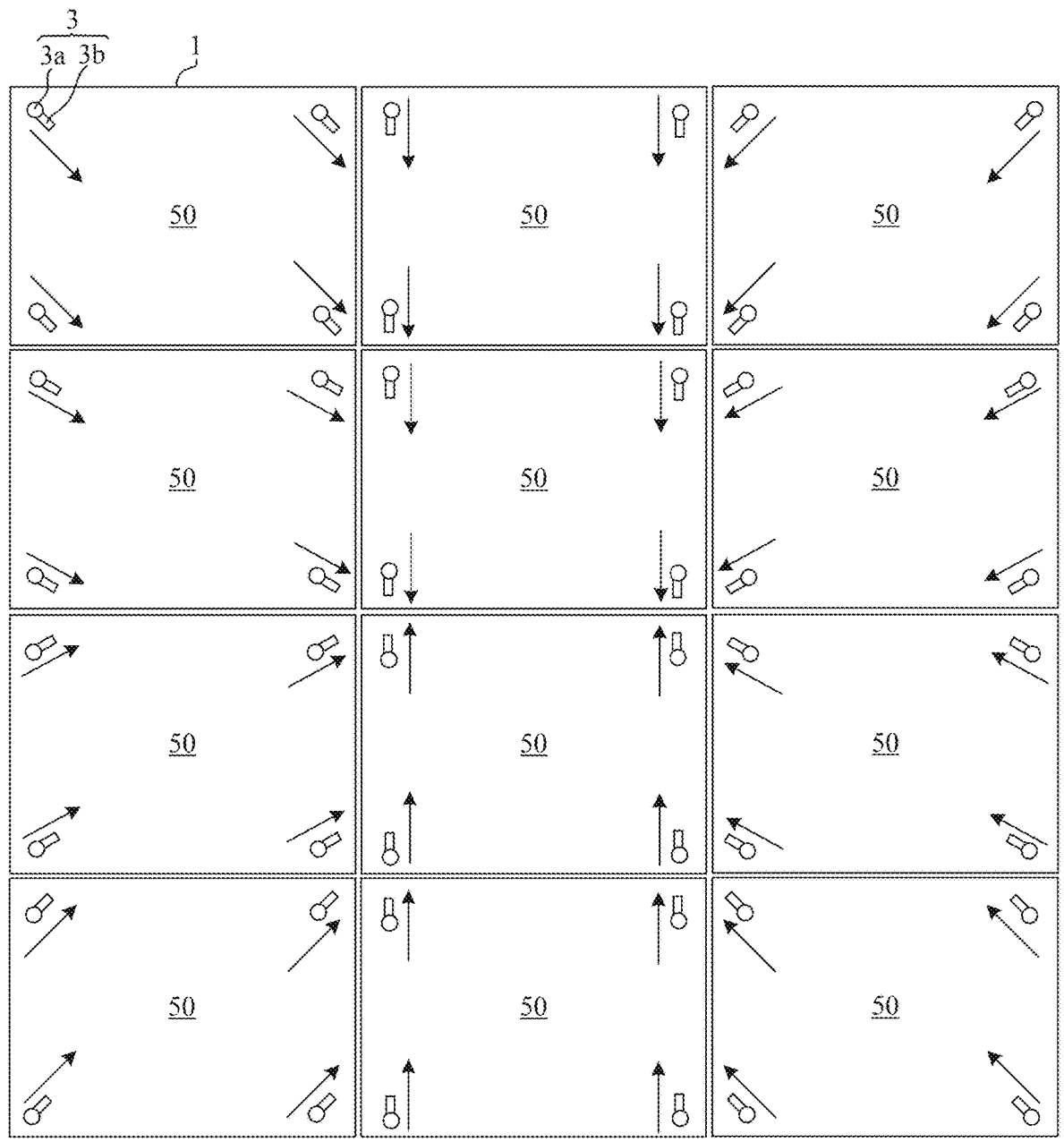
FIG. 12 is a schematic diagram of a moving direction of each adjustment structure in FIG. 11 after temperature rises.

FIG. 11 is a schematic diagram of splicing a plurality of sub-display panel modules in an embodiment of the present disclosure. FIG. 12 is a schematic diagram showing a direction of movement of each adjustment structure 3 in FIG. 11 after a temperature rises. As shown in FIGS. 1 to 12, only bracket structures 50 (display substrates are not shown) in the sub-display panel modules are illustrated in FIGS. 11 and 12, each bracket structure 50 includes four adjustment structures 3 (four positioning structures 2), and the four adjustment structures 3 (four positioning structures 2) are respectively located in four corner areas of the bracket structure 50.

In some embodiments, the adjustment member 8 included in the adjustment portion 3b of each adjustment structure 3 includes a thermostrictive component and a stopper 7. For a specific description of the thermostrictive component and the stopper 7 see the contents of the preceding embodiments. Further, the connection portion 3a in any of the adjustment structures 3 in the bracket structure 50 is located on a side of the adjustment portion 3b away from a central region of the tiled display device, and the extending direction of the second via hole 33 in the adjustment portion 3b faces the central region of the tiled display device.

In a subsequent display process, heat generated after the display substrate is lit will cause the temperature of the bracket structures 50 to rise, and the thermostrictive components in the bracket structures 50 will be elongated and deformed. For any one of the thermostrictive components, the mutual pressing force between the thermostrictive component and the positioning pin 4 increases and causes the corresponding adjustment structure 3, the positioning structure 2, and the portion of the bracket structure 50 located near the positioning structure 2 to be slightly moved along the second via hole 33 and away from the positioning pin 4. That is, the region where the positioning structure 2 is provided on each bracket structure 50 and the portion of the adjacent region are slightly moved towards the central region close to the tiled display device. At this time, the splicing gap between adjacent bracket structures 50 can be effectively reduced, which is beneficial to improving an overall display effect.

Further, optionally, the number of adjustment structures 3 in the bracket structure 50 is a plurality, and the extending directions of the second via holes 33 in the adjustment portions 3b in the plurality of adjustment structures 3 in the same bracket structure 50 are parallel to each other. With this design, each adjustment structure 3/positioning structure 2 located on the same bracket structure 50 can move in the same direction when the temperature changes, so that each area of the bracket structure 50 can move synchronously.

In accordance with embodiments of the present application as described above, these embodiments are not exhaustively described in all detail nor are the present application limited to the specific embodiments described. Obviously, according to the above description, many modifications and changes can be made. These embodiments are selected and specifically described in this specification in order to better explain the principles and practical applications of the present application, thereby enabling those skilled in the art to make good use of the present application and modifications on the basis of the present application. The present application is limited only by the claims and full scope thereof and equivalents.

The invention claimed is:

1. A bracket structure, comprising:
a bracket body provided with an assembly surface, wherein at least one positioning structure is provided on one side of the assembly surface of the bracket body, the positioning structure is connected with the bracket body, a positioning hole is provided at one end of the positioning structure away from the bracket body, and an extending direction of the positioning hole intersects with a plane where the assembly surface is located;
at least one adjustment structure which is in one-to-one correspondence with the positioning structure, wherein the at least one adjustment structure comprises a connection portion and an adjustment portion, the connection portion is provided with a first via hole; an extending direction of the first via hole is parallel to the extending direction of the positioning hole; the first via hole comprises a first portion and a second portion arranged in sequence along the extending direction of the first via hole and in a direction away from the bracket body; at least a part of the positioning structure is located in a first portion of a corresponding first via hole and is connected with the first portion, and the positioning hole on the positioning structure is exposed by the corresponding first via hole; the adjustment portion is connected with a side wall of the connection portion; the adjustment portion is provided with a second via hole, and an extending direction of the second via hole intersects with the extending direction of the first via hole; the second via hole is communicated with the second portion of the first via hole, and an adjustment member is provided in the second via hole; and the adjustment member is configured to be movable along the second via hole and is extendable into the second portion of the first via hole.

2. The bracket structure of claim 1, wherein the connection portion is configured to be rotatable about the positioning structure so that the extending direction of the second via hole in the adjustment portion connected with the connection portion is changed.

3. The bracket structure of claim 1, wherein an outer wall of the positioning structure is provided with a first external thread, and an inner wall of the first portion of the first via hole is provided with a first internal thread matched with the first external thread, and the positioning structure is screwed with a corresponding connection portion through the first external thread and the first internal thread.

4. The bracket structure of claim 3, wherein a first accommodation groove is provided at one end of the adjustment structure close to the bracket body, and the first accommodation groove is provided with an opening towards the bracket body, and a first elastic component is provided in the first accommodation groove, one end of the first elastic component is in contact with a groove bottom of the first accommodation groove, and the other end of the first elastic component is in contact with the bracket body.

5. The bracket structure of claim 4, wherein the first accommodation groove is an annular groove surrounding the first portion of the first via hole.

6. The bracket structure of claim 1, wherein an outer wall of the positioning structure is provided with a notch;
a third via hole is provided on a side wall of the first portion of the first via hole, a detent pin is arranged in the third via hole, the detent pin is capable of moving along the third via hole, and one end of the detent pin close to the notch is extendable into the notch to engage with the notch.

7. The bracket structure of claim 6, wherein the notch is an annular notch surrounding the positioning hole;
wherein the outer wall of the positioning structure is provided with a first external thread, and an inner wall of the first portion of the first via hole is provided with a first internal thread matched with the first external thread, an inner wall of the third via hole is provided with a second internal thread, an outer wall of the detent pin is provided with a second external thread matched with the second internal thread, and the detent pin and the third via hole are screwed with each other through the second internal thread and the second external thread.

8. The bracket structure of claim 1, wherein the adjustment member comprises a stretchable deformable component and a stopper arranged sequentially along the extending direction of the second via hole in a direction away from the connection portion, and the stopper is connected with the second via hole;

the stretchable deformable component is configured to be capable of generating stretchable deformation in the extending direction of the second via hole; and the stopper is configured to be movable along the second via hole in response to external adjustment to change a position of the stopper in the second via hole.

9. The bracket structure of claim 8, wherein an outer wall of the positioning structure is provided with a first external thread, and an inner wall of the first portion of the first via hole is provided with a first internal thread matched with the first external thread, a third via hole is provided on a side wall of the first portion of the first via hole, a detent pin is arranged in the third via hole, an inner wall of the third via hole is provided with a second internal thread, an outer wall of the detent pin is provided with a second external thread matched with the second internal thread, wherein the inner wall of the second via hole is provided with a third internal thread, an outer wall of the stopper is provided with a third external thread adapted to the third internal thread, and the stopper is screwed with the second via hole through the third internal thread and the third external thread.

10. The bracket structure of claim 8, wherein the stretchable deformable component is a thermostrictive component;

the thermostrictive component is configured to be elongated and deformed in the extending direction of the second via hole with an increase in temperature, and to produce shorten deformation in the extending direction of the second via hole with a decrease in temperature.

11. The bracket structure of claim 10, wherein the stretchable deformable component comprises a memory spring.

12. The bracket structure of claim 8, wherein a limit groove is provided at an end of the adjustment portion away from the connection portion, an extending direction of the limit groove is parallel to the extending direction of the second via hole, the limit groove has a first length in the extending direction of the limit groove, the second via hole has a second length in the extending direction of the second via hole, and the first length is less than the second length; and the limit groove is located on one side of the second via hole and is communicated with the second via hole, and a part of the stretchable deformable component is located in the limit groove.

13. The bracket structure of claim 12, wherein the limit groove is located on one side of the second via hole adjacent to the bracket body.

14. The bracket structure of claim 1, wherein the connection portion and the adjustment portion are integrally formed.

15. The bracket structure of claim 1, wherein a first accommodation groove is provided at one end of the adjustment structure close to the bracket body, wherein the assembly surface of the bracket body is provided with a plurality of second accommodation grooves which are in one-to-one correspondence with the positioning structures;

the positioning structures are located in corresponding second accommodation grooves, one end of each positioning structure close to the bracket body is connected with a groove bottom of a corresponding second accommodation groove, and a part of the connection portion is located in the second accommodation groove; or wherein an outer edge of the assembly surface is rectangular, and four positioning structures are provided on one side of the bracket body on the assembly surface, and the four positioning structures are located respectively in four corner areas of the assembly surface whose outer edge is rectangular; or wherein the assembly surface is divided into an intermediate region and a peripheral region surrounding the intermediate region, and the positioning structures are located in the peripheral region; and a plurality of hollow structures penetrating the bracket body are provided in the intermediate region.

16. The bracket structure of claim 15, wherein a first fixation component is further provided on the assembly surface and located in the peripheral region, and the first fixation component is configured to be fixed to a casing.

17. A sub-display panel module, comprising: a bracket structure of claim 1 and a display substrate, wherein the bracket body in the bracket structure further comprises a bearing surface disposed opposite to the assembly surface, and the display substrate is located on the bearing surface.

18. A tiled display device, comprising a plurality of sub-display panel modules and a casing for assembling the sub-display panel modules, wherein at least one of the sub-display panel modules is the sub-display panel modules of claim 17.

19. The tiled display device of claim 18, wherein the casing is provided with a positioning pin configured to extend into the positioning hole exposed by the first via hole through a corresponding first via hole;

a part of the adjustment member extending into the second portion of the first via hole is in contact with a part of the positioning pin located in the second portion of the first via hole and the part of the adjustment member and the part of the positioning pin are pressed against each other.

20. The tiled display device of claim 19, wherein the bracket structures in the sub-display panel modules is the bracket structure of claim 10, the connection portion in any of the adjustment structures is located on a side of the adjustment portion away from a central region of the tiled display device, and the extending direction of the second via hole in the adjustment portion faces the central region of the tiled display device; and wherein a plurality of the adjustment structures are provided in the bracket structure, and extending directions of the second via holes on the adjustment portions in the plurality of adjustment structures located in a same bracket structure are parallel.

* * * * *